(12) United States Patent
Tabachnik et al.

(10) Patent No.: US 10,025,669 B2
(45) Date of Patent: Jul. 17, 2018

(54) MAINTAINING DATA-SET COHERENCY IN NON-VOLATILE MEMORY ACROSS POWER INTERRUPTIONS

(71) Applicant: Nuvoton Technology Corporation, Hsin-chu (TW)

(72) Inventors: Boaz Tabachnik, Herzlia B (IL); Ziv Hershman, Givat Shmuel (IL); Yael Kanter, Givatayim (IL)

(73) Assignee: Nuvoton Technology Corporation, Hsin-chu (TW)

( * ) Notice: Subject to any disclaimer, the term of this patent is extended or adjusted under 35 U.S.C. 154(b) by 301 days.

(21) Appl. No.: 14/975,882

(22) Filed: Dec. 21, 2015

(65) Prior Publication Data
US 2016/0231940 A1    Aug. 11, 2016

Related U.S. Application Data

(60) Provisional application No. 62/095,796, filed on Dec. 23, 2014.

(51) Int. Cl.
| G06F 3/06 | (2006.01) |
| G11C 16/10 | (2006.01) |
| G06F 11/14 | (2006.01) |
| G11C 16/20 | (2006.01) |

(52) U.S. Cl.
CPC ...... *G06F 11/1441* (2013.01); *G06F 2201/82* (2013.01); *G06F 2201/84* (2013.01); *G11C 16/20* (2013.01)

(58) Field of Classification Search
CPC ............ G06F 11/1441; G06F 2201/82; G06F 2201/84; G11C 16/20
See application file for complete search history.

(56) References Cited

U.S. PATENT DOCUMENTS

| 5,504,883 | A | 4/1996 | Coverston et al. |
| 5,561,795 | A | 10/1996 | Sarkar |
| 5,564,011 | A | 10/1996 | Yammine et al. |
| 5,625,819 | A | 4/1997 | Hoffer, Jr. |
| 5,974,426 | A | 10/1999 | Lee et al. |
| 6,769,053 | B1 | 7/2004 | De Jong et al. |
| 7,373,366 | B1 * | 5/2008 | Chatterjee ........... G06F 11/1451 |
| 7,516,267 | B2 | 4/2009 | Coulson et al. |
| 7,849,057 | B1 * | 12/2010 | Kazar ............... G06F 17/30088 |
| | | | 707/637 |
| 8,677,203 | B1 | 3/2014 | Shalvi et al. |

(Continued)

OTHER PUBLICATIONS

Woodhouse, David. "JFFS: The Journaling Flash File System", [online], Ottawa Linux Symposium, Jul. 2001, Internet, http://sources.redhat.com/jffs2/jffs2.pdf.*

*Primary Examiner* — Yaima Rigol
(74) *Attorney, Agent, or Firm* — D. Kligler IP Services Ltd.

(57) ABSTRACT

A method for data storage includes storing data in a set of memory blocks of a non-volatile memory. Each memory block, which holds a respective portion of the data, is classified as valid or invalid depending on whether the memory block holds a most updated version of the portion, and as anchor or non-anchor depending on whether the portion belongs to a coherent snapshot of the data. Upon recovering from a power interruption, the coherent snapshot of the data is reconstructed from the memory blocks, based on classification of the memory blocks as valid or invalid and as anchor or non-anchor.

18 Claims, 2 Drawing Sheets

(56) References Cited

U.S. PATENT DOCUMENTS

| | | |
|---|---|---|
| 8,874,515 B2 | 10/2014 | Bodwin et al. |
| 8,977,830 B1 | 3/2015 | Clark |
| 2010/0061150 A1 | 3/2010 | Wu et al. |
| 2010/0280996 A1* | 11/2010 | Gross, IV ........... G06F 11/1451 707/649 |
| 2011/0131365 A1* | 6/2011 | Zhang ................. G06F 11/1441 711/103 |

* cited by examiner

MAINTAINING DATA-SET COHERENCY IN NON-VOLATILE MEMORY ACROSS POWER INTERRUPTIONS

CROSS-REFERENCE TO RELATED APPLICATIONS

This application claims the benefit of U.S. Provisional Patent Application 62/095,796, filed Dec. 23, 2014, whose disclosure is incorporated herein by reference.

FIELD OF THE INVENTION

The present invention relates generally to data storage, and particularly to methods and systems for maintaining data-set coherency in non-volatile memory.

BACKGROUND OF THE INVENTION

Various systems and applications store data in non-volatile memory. In some applications, a certain body of data is defined as a data-set that should be maintained coherently en bloc, notwithstanding failures and power interruptions. Various techniques for maintaining data-set coherency are known in the art.

For example, U.S. Pat. No. 6,769,053, whose disclosure is incorporated herein by reference, describes techniques for storing a data structure for supporting persistent storage of a set of data. In one aspect, a method stores in the data structure at least an oldest version of the set of data and a first tag identifying the oldest version in a first memory area. The method includes storing, in the data structure, at least a most recently updated version of the set of data and a second tag identifying the most recently updated version in a second memory area. The method may also include deallocating the first memory area following the storing of the most recently updated version provided there are at least two versions of the set of data in the data structure.

U.S. Pat. No. 8,874,515, whose disclosure is incorporated herein by reference, describes techniques for data versioning in a non-volatile memory. An object key associated with a data object is created. An index into an object table is generated using the object key. A version number is stored in conjunction with the data object stored in the non-volatile memory. In an object linked-list, the object key and the location information of the data object in the non-volatile memory are stored. A record associated with the data object is created in an object table. The record includes an index, a reference to the object linked-list, and the version number. The index is generated based on the object key.

SUMMARY OF THE INVENTION

An embodiment that is described herein provides a method for data storage, including storing data in a set of memory blocks of a non-volatile memory. Each memory block, which holds a respective portion of the data, is classified as valid or invalid depending on whether the memory block holds a most updated version of the portion, and as anchor or non-anchor depending on whether the portion belongs to a coherent snapshot of the data. Upon recovering from a power interruption, the coherent snapshot of the data is reconstructed from the memory blocks, based on classification of the memory blocks as valid or invalid and as anchor or non-anchor.

In some embodiments, the method further includes updating the portion of the data that is stored in an existing memory block by writing the updated portion to a new memory block, classifying the new memory block as valid, and re-classifying the existing memory block as invalid. In some embodiments, the method further includes creating the coherent snapshot by: in a first phase, identifying the memory blocks in the set that are classified as valid and non-anchor, and re-classifying the identified memory blocks as anchor; and in a second phase, for each memory block identified in the first phase, finding a corresponding memory block that holds a previous version of the portion held by the memory block, and re-classifying the corresponding memory block as non-anchor.

In some embodiments, reconstructing the coherent snapshot includes: constructing a first list containing the memory blocks that are classified as anchor and valid, and a second list containing the memory blocks that are classified as anchor and invalid; and reconstructing the coherent snapshot based on the first and second lists. In an embodiment, reconstructing the coherent snapshot includes extracting the data from the memory blocks on the first list if the entire data is available in the memory blocks on the first list.

In an embodiment, if the memory blocks on the first list do not includes the entire data, reconstructing the coherent snapshot includes, per portion of the data: if the portion is available in the memory blocks on the second list, extracting the portion from the second list; and if the portion is not available in the memory blocks on the second list, extracting the portion from the first list. In an example embodiment, classifying each memory block includes setting a respective valid/invalid flag and a respective anchor/non-anchor flag in each memory block.

There is additionally provided, in accordance with an embodiment of the present invention, a data storage apparatus including an interface and a processor. The interface is configured for communicating with a non-volatile memory including a set of memory blocks. The processor is configured to store data in the set of memory blocks, to classify each memory block, which holds a respective portion of the data, as valid or invalid depending on whether the memory block holds a most updated version of the portion, and as anchor or non-anchor depending on whether the portion belongs to a coherent snapshot of the data, and, upon recovering from a power interruption, to reconstruct the coherent snapshot of the data from the memory blocks, based on classification of the memory blocks as valid or invalid and as anchor or non-anchor.

There is additionally provided, in accordance with an embodiment of the present invention, a data storage apparatus including a non-volatile memory and a memory controller. The non-volatile memory includes a set of memory blocks. The memory controller is configured to store data in the set of memory blocks, to classify each memory block, which holds a respective portion of the data, as valid or invalid depending on whether the memory block holds a most updated version of the portion, and as anchor or non-anchor depending on whether the portion belongs to a coherent snapshot of the data, and, upon recovering from a power interruption, to reconstruct the coherent snapshot of the data from the memory blocks, based on classification of the memory blocks as valid or invalid and as anchor or non-anchor.

The present invention will be more fully understood from the following detailed description of the embodiments thereof, taken together with the drawings in which:

DETAILED DESCRIPTION OF EMBODIMENTS

Overview

Various data processing applications require data-set coherency from their memory systems. In such applications, a certain body of data is defined as a data-set, and the memory system is required to create and maintain "snapshots"—Versions of the data-set that the system can revert to.

Embodiments of the present invention that are described herein provide improved methods and systems for supporting data-set coherency in Flash memory or other non-volatile memory. In some embodiments, a disclosed memory system creates a coherent snapshot that can be reverted to when recovering from power interruption.

It is possible in principle to create a snapshot by copying the entire data-set to a dedicated memory location. This naïve solution, however, is extremely costly in terms of latency. The disclosed techniques support highly-efficient creation and reconstruction of snapshots using classification (e.g., flagging) of memory blocks.

In an example embodiment, a memory controller manages storage of data in a non-volatile memory that comprises multiple memory blocks. The memory controller classifies each memory block, which holds a respective portion of the data, as "valid" or "invalid" depending on whether the memory block holds the most updated version of the portion of data. The memory controller also classifies each memory block as "anchor" or "non-anchor" depending on whether the portion of data stored in the memory block belongs to the coherent snapshot of the data. Upon recovering from power interruption, the memory controller reconstructs the coherent snapshot from the memory blocks, based on the classification of the memory blocks as valid/invalid and anchor/non-anchor.

In some embodiments, the classification is implemented by maintaining a "valid" flag and an "anchor" flag in each memory block. Example methods for creating and reconstructing a snapshot using this classification are described herein. These methods manage snapshots exclusively using flag manipulation, without a need to copy actual data for the sake of creating a snapshot. As such, the disclosed techniques incur very small latency.

System Description

Figure 1:
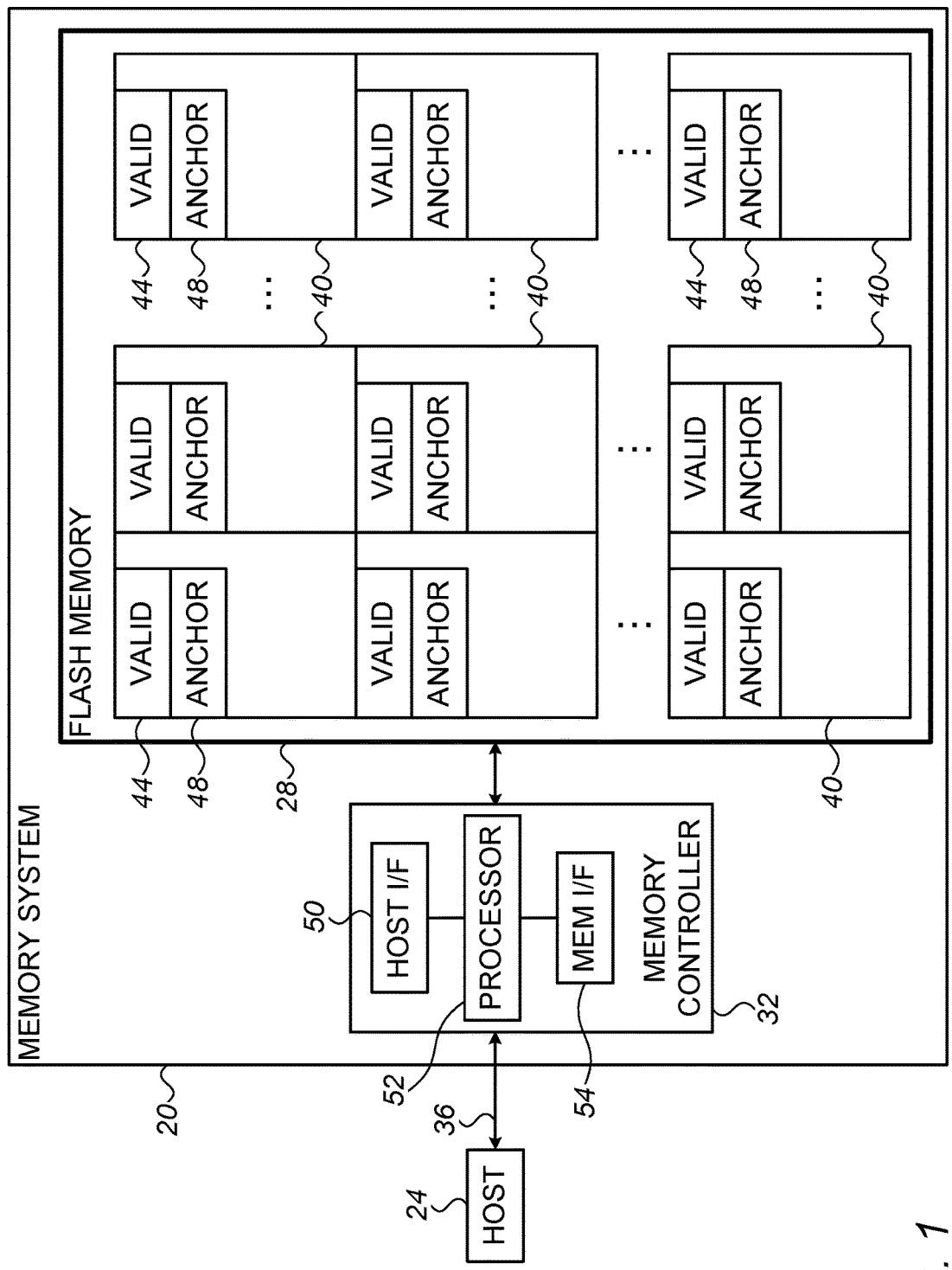
FIG. 1 is a block diagram that schematically illustrates a memory system that supports data-set coherency, in accordance with an embodiment of the present invention.

FIG. 1 is a block diagram that schematically illustrates a memory system 20 that stores data in a non-volatile memory for a host 24, in accordance with an embodiment of the present invention. System 20 may comprise, for example, a secure memory card, a Solid State Drive (SSD), or any other type of system that stores data in non-volatile memory. In an example embodiment, system 20 is implemented in a single device package, e.g., as a System-on-Chip (SoC) or Multi-Chip Package (MCP).

System 20 comprises a non-volatile memory, in the present example a Flash memory 28, and a memory controller 32. The memory controller manages the storage and retrieval of data in Flash memory 28, and communicates with host 24 over a bus or other interface 36. In the present example, memory controller 32 comprises a host interface 50 for communicating with host 24, a memory interface 54 for communicating with Flash memory 28, and a processor 52 that is configured to carry out the various memory management methods described herein.

Flash memory 28, which may comprise one or more memory devices or dies, comprises a plurality of memory blocks 40. Each memory block 40 comprises an array of Flash memory cells used for non-volatile storage of data. Memory blocks 40 are also referred to as physical blocks.

Typically in Flash memory, data cannot be updated in-place, and memory cells must be erased before re-programming. Erasure is performed in memory-block units. When the host updates certain data, memory controller 32 typically writes the new version of the data in a new physical location in the memory, and invalidates the previous physical location that holds the previous version of the data. The memory controller also carries out a "garbage collection" process, which erases physical blocks whose data has been invalidated and frees the blocks for storing new data. As will be explained below, memory controller refrains from erasing invalidated blocks if they are defined as "anchor," i.e., part of a coherent snapshot of a data-set.

The above memory management process is usually transparent to the host. For this purpose, memory controller 32 typically applies logical-to-physical address mapping. Toward host 24, memory controller 32 exposes a contiguous, monotonic address space of logical addresses that is agnostic to the internal management of physical storage locations. The memory controller translates the logical addresses into respective physical addresses in which the data is physically stored in Flash memory 28. When data is updated by the host, the physical address of the data changes but the logical address remains the same, and the memory controller updates the logical-to-physical address mapping accordingly.

In the embodiments described herein, memory controller 32 supports data-set coherency and snapshots using methods that are described below. For managing snapshots, processor 52 of the memory controller marks each physical memory block with two flags—A valid flag and an anchor flag 48. Since Flash memory cannot be overwritten in-place, each flag may comprise more than a single bit in order to enable the memory controller to set and/or reset it as needed.

Generally speaking, processor 52 marks a block 40 as valid if the block holds the most updated version of the data stored therein, and as invalid otherwise. Processor 52 marks a block 40 as anchor if the data the block holds is part of the most recent snapshot of the data-set, and as non-anchor otherwise. Methods for creating a coherent snapshot of the data-set, and for recovering from power interruption using the coherent snapshot, all using the above-described flags, are given below.

The configuration of memory system 20 shown in FIG. 1 is an example configuration that is depicted purely for the sake of conceptual clarity. In alternative embodiments, any other suitable system configuration can be used. For example, the disclosed techniques are not limited to Flash memory and can be used with any other suitable type of non-volatile memory, such as with other types of solid-state non-volatile memory or with Hard Disk Drive (HDD) memory.

As another example, in alternative embodiments, memory controller 32 may classify and flag memory units that are smaller than an entire physical Flash memory block (also referred to sometimes as erasure block). In the context of the present patent application and in the claims, such smaller memory units are also referred to as "memory blocks."

The different elements of system 20 may be implemented using any suitable hardware, such as in an Application-Specific Integrated Circuit (ASIC) or Field-Programmable Gate Array (FPGA). In some embodiments, some elements of system 20, e.g., elements of processor 52 of memory controller 32, can be implemented using software, or using a combination of hardware and software elements.

In some embodiments, processor 52 comprises a general-purpose programmable processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

Maintaining Data-Set Coherency Across Power Interruptions Using "Valid" and "Anchor" Memory-Block Classification In some embodiments, memory controller 32 exposes to host 24 a logical address space that spans K logical blocks, whereas the actual number of physical memory blocks 40 is N, wherein K<N/2. The K logical blocks are referred to as a data-set, and memory controller 32 supports creation and management of a coherent snapshot of this data-set. The physical memory size that is not exposed to the host is used internally for various management tasks, including snapshot management.

The description that follows refers to the entire logical address space as a data-set, for the sake of clarity. In alternative embodiments, however, memory controller 32 may support smaller data-sets that comprise only partial subsets of the logical address space.

In some embodiments, processor 52 of memory controller 32 assigns each logical block a respective block index. When several physical blocks 40 hold different versions of the same logical block (of which only one version is typically valid), all these physical blocks are assigned the same block index. The block index may coincide with the logical address of the block, as known to the host, or it may be a separate index.

In some embodiments, processor 52 sets valid flags 44 and anchor flags 48 in the various physical blocks 40 during data storage. If a block 40 holds the most updated version of the data stored therein, flag 44 of this block is set to "valid." If a block 40 holds an older, obsolete version of the data stored therein, flag 44 of this block is set to "invalid." If the data stored in a block 40 is part of the most recent snapshot of the data-set, flag 48 of this block is set to "anchor." If the data stored in a block 40 is not part of the most recent snapshot of the data-set, flag 48 of this block is set to "non-anchor."

It is important to note that in practice, all four combinations of valid/invalid and anchor/non-anchor are possible. For example, if the data was updated after the snapshot was created, a physical block 40 may hold the most up-to-date version of the data stored therein, but not yet be part of the snapshot, in which case it is classified as valid but non-anchor. By the same token, a physical block 40 may be part of the snapshot, but hold an obsolete version of the data stored therein, in which case it is classified as invalid but anchor.

In some embodiments, when host 24 updates a certain logical block, processor 52 writes the updated version of the logical block into a new physical block, assigns the new physical block the same block index as the old physical block, classifies the new physical block as valid, and classifies the old physical block as invalid.

In some embodiments, memory controller 32 supports a "commit" instruction, using which host 24 instructs the memory controller to create a coherent snapshot of the data-set. Upon recovering from power interruption, memory controller 32 is able to reconstruct the data-set coherently by reverting to the snapshot.

Figure 2:
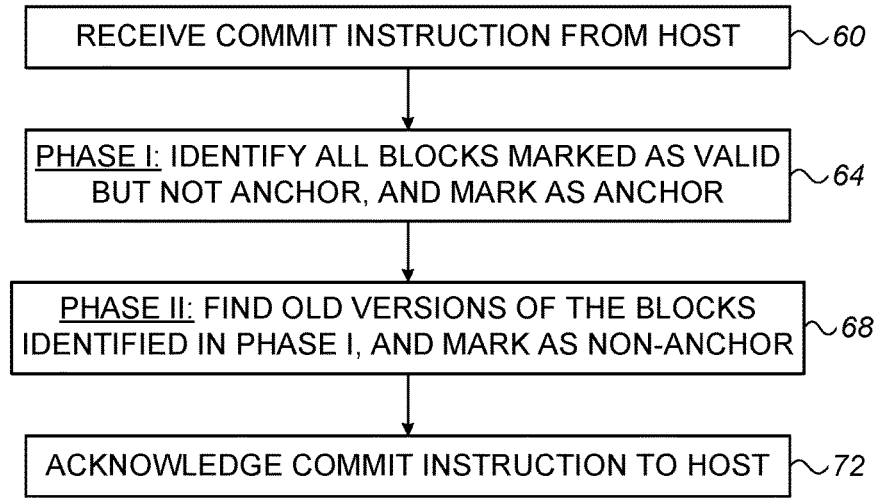
FIG. 2 is a flow chart that schematically illustrates a method for implementing a commit instruction for creating a snapshot, in accordance with an embodiment of the present invention.

FIG. 2 is a flow chart that schematically illustrates a method for implementing a commit instruction, in accordance with an embodiment of the present invention. The method begins with processor 52 of memory controller 32 receiving a commit instruction from host 24 via host interface 50, at a commit reception step 60.

In response to the commit instruction, the memory controller is expected to retain the most up-to-date version of the data, across the various physical memory blocks, and retain this up-to-date version as a snapshot that can be reverted to at a later time. In some embodiments, although not necessarily, the host will refrain from issuing new write commands until the memory controller has acknowledged the commit instruction.

In the present example, processor 52 executes the commit instruction in a two-phase process. At a phase I step 64, processor 52 identifies all the physical blocks that are marked as "valid" and "non-anchor," and re-classifies them as "anchor."

At a phase II step 68, for each memory block that was identified and re-classified at step 64, processor 52 finds the memory block that holds the previous version of this memory block. (The block holding the previous version will have the same block index as the block holding the valid version.) Processor 52 re-classifies the found blocks as "non-anchor."

After completing phases I and II, processor 52 acknowledges completion of the commit instruction to host 24, at an acknowledgement step 72.

At this stage, the set of memory blocks marked as "anchor" collectively hold the newly-created snapshot of the data-set. This snapshot is coherent, in the sense that it reflects the true state of the entire data-set at the time of creation, without any intervening write operations.

From this point onwards, new updates to the data will cause new memory blocks to be written and become "valid," and some of the memory blocks belonging to the snapshot will thus become "invalid." Nevertheless, the memory blocks belonging to the snapshot will remain classified as "anchor" as long as no additional commit instruction is received. If system 20 undergoes and recovers from power interruption, processor 52 uses the "anchor" classification to reconstruct the coherent snapshot.

Typically, when using this technique, any "garbage collection" process performed by memory controller 32 should refrain from erasing blocks flagged as "anchor" even if they are flagged as "invalid."

Figure 3:
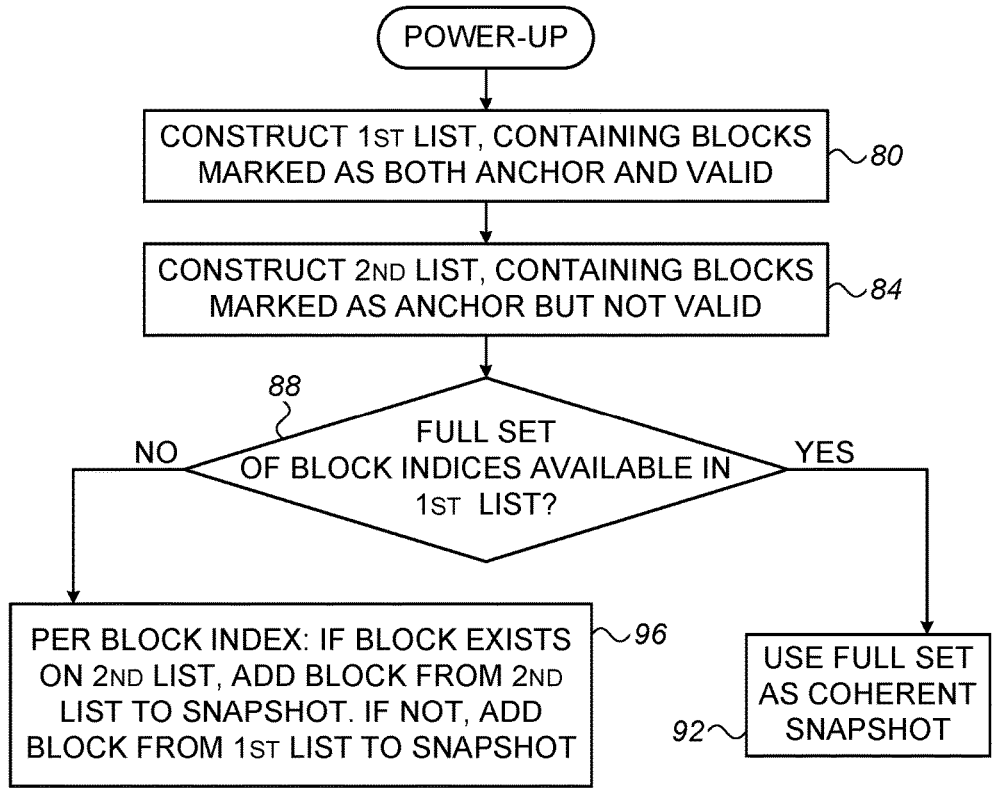
FIG. 3 is a flow chart that schematically illustrates a method for recovering from power interruption while maintaining data-set coherency, in accordance with an embodiment of the present invention.

FIG. 3 is a flow chart that schematically illustrates a method for recovering from power interruption, in accordance with an embodiment of the present invention. The method of FIG. 3 is typically carried out by processor 52 of memory controller 32, as part of the power-up procedure following power interruption. In the present context, the term "power interruption" refers to both unintentional interruption, e.g., due to failure, and intentional removal of electrical power.

The method begins with processor 52 constructing two lists of physical memory blocks 40. At a first list construction step 80, processor 52 constructs a first list of the memory blocks that are classified as both "anchor" and "valid." At a second list construction step 84, processor 52 constructs a second list of the memory blocks that are classified as "anchor" but "invalid."

At a full-set checking step 88, processor 52 checks whether the first list contains a full set of memory blocks that collectively contain the entire data set. For example, processor 52 may check whether the first list contains the full set of indices.

If the first list indeed contains the entire data-set, processor 52 uses this full set of block from the first list as the snapshot, at a single-list selection step 92.

Otherwise, i.e., if the first list does not contain the entire data-set, processor 52 selects for the snapshot memory blocks from both lists, at a dual-list selection step 96. For each block index, if the second list contains a memory block having this block index, processor 52 adds the block from the second list to the snapshot. If the second list does not contain a memory block having this block index, processor 52 adds the block from the first list having the block index in question to the snapshot. This selection ensures that the blocks selected for the recovered snapshot will all contain the most updated version of the data that is still coherent, i.e., defined as "anchor."

Example Pseudo-Code

The following pseudo-code demonstrates one example implementation of the methods described herein. In some embodiments, a block may be classified with other classifications, in addition to anchor/non-anchor and valid/invalid.

In the example pseudo-code that follows, the terms "committed" and "ex.committed" correspond to "anchor" and "non-anchor," respectively. For example, an operation such as "mark p.committed" means that block p is classified as anchor. An operation such as "mark p.ex_committed" means that block p is un-classified as anchor, i.e., classified as non-anchor. A page that is marked as both "committed" and "ex.committed" is regarded as non-anchor.

In addition, the pseudo-code uses the following terminology:
"Dirty"—A block that is not erased.
"Valid"—As explained above.
"Anchor"—As explained above. Also referred to as "committed."
"Index"—The logical address of the page, as explained above.
"Obsolete"—A page classified as "invalid," i.e. un-classified as valid.
"Start_peer_erase"—While copying a page-to-page, the source is classified as start_peer_erase in order to distinguish (in case of power interruption) between the source and the destination.

A digest of a block comprises additional information that enables authentication of the data in the block.

```
Init flash (once in life cycle)
    for each page p from the initial K active pages
        Mark p.dirty p.valid p.anchor
        p.index = its index (0..K-1)
        pagesTable[ p.index ] = p
    (pagesTable always points to the active pages.)
rollPage from oldPage to newPage obsoleting pageToObsolete
    (Usually pageToObsolete == oldPage. if reconstruct an
obsolete anchor, first obsolete the current valid page.)
        if pageToObsolete.committed
            mark pageToObsolete.ex_committed
        mark pageToObsolete.obsolete
    simple case: obsolete old page
        mark newPage.dirty
        mark oldPage.start_peer_erase
        copy data
        mark newPage.valid
        mark oldPage.obsolete
commit( )
    for each page p in pagesTable
        if !p.committed
            mark p.committed
    (At this stage we have the new set of anchors
    even in case of power-fail)
    // Mark the old anchors
    for each page (.committed && !.ex_committed &&
.obsolete)
        mark the page as ex_committed
powerUp( )
    // Step A: collect candidates
    for each page p {
        if digest( p ) is OK {
            if the p. valid & !p.obsolete
                pagesTable[ p.index ] = p
            if p.committed && !p.ex_commited && p.obsolete
            (i.e. p is an "old anchor")
                anchors[ p.index ] = p
        }
    }
    // Step B: choose set of pages
    if all the pages in pagesTable are (.committed &&
!.ex_committed)
        do nothing - pagesTable[ ] is the actual set
    else
        for each page p in anchors[ ]
            rollPage p to a new page q obsoleting
pagesTable[ p.index ]
            mark q.committed
            pagesTable[ q.index ] = q
        for each page p in anchors[ ]
            mark p.ex_committed
```

It will be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:
1. A method for data storage, comprising:
   storing data in a set of memory blocks of a non-volatile memory;
   classifying each memory block, which holds a respective portion of the data, as valid or invalid depending on whether the memory block holds a most updated ver- sion of the portion, and as anchor or non-anchor depending on whether the portion belongs to a coherent snapshot of the data;

creating a new coherent snapshot of the data, by:
  in a first phase, identifying the memory blocks in the set that are classified as valid and non-anchor, and re-classifying the identified memory blocks as anchor; and
  in a second phase, which begins only after all the memory blocks identified in the first phase as valid and non-anchor have been re-classified, finding for each memory block identified in the first phase a corresponding memory block that holds a previous version of the portion held by the memory block, and re-classifying the corresponding memory block as non-anchor; and upon recovering from a power interruption, reconstructing the new coherent snapshot of the data from the memory blocks, based on classification of the memory blocks as valid or invalid and as anchor or non-anchor.

2. The method according to claim 1, and comprising updating the portion of the data that is stored in an existing memory block by writing the updated portion to a new memory block, classifying the new memory block as valid, and re-classifying the existing memory block as invalid.

3. The method according to claim 1, wherein reconstructing the new coherent snapshot comprises:
  constructing a first list containing the memory blocks that are classified as anchor and valid, and a second list containing the memory blocks that are classified as anchor and invalid; and
  reconstructing the new coherent snapshot based on the first and second lists.

4. The method according to claim 3, wherein reconstructing the new coherent snapshot comprises extracting the data from the memory blocks on the first list if the entire data is available in the memory blocks on the first list.

5. The method according to claim 4, wherein, if the memory blocks on the first list do not comprise all the data, reconstructing the new coherent snapshot comprises, per portion of the data:
  if the portion is available in the memory blocks on the second list, extracting the portion from the second list; and
  if the portion is not available in the memory blocks on the second list, extracting the portion from the first list.

6. The method according to claim 1, wherein classifying each memory block comprises setting a respective valid/invalid flag and a respective anchor/non-anchor flag in each memory block.

7. A data storage apparatus, comprising:
  an interface for communicating with a non-volatile memory comprising a set of memory blocks; and
  a processor, configured to:
    store data in the set of memory blocks;
    classify each memory block, which holds a respective portion of the data, as valid or invalid depending on whether the memory block holds a most updated version of the portion, and as anchor or non-anchor depending on whether the portion belongs to a coherent snapshot of the data;
    create a new coherent snapshot of the data, by:
      in a first phase, identifying the memory blocks in the set that are classified as valid and non-anchor, and re-classifying the identified memory blocks as anchor; and
      in a second phase, which begins only after all the memory blocks identified in the first phase as valid and non-anchor have been re-classified, finding for each memory block identified in the first phase a corresponding memory block that holds a previous version of the portion held by the memory block, and re-classifying the corresponding memory block as non-anchor; and
    upon recovering from a power interruption, reconstruct the new coherent snapshot of the data from the memory blocks, based on classification of the memory blocks as valid or invalid and as anchor or non-anchor.

8. The apparatus according to claim 7, wherein the processor is configured to update the portion of the data that is stored in an existing memory block by writing the updated portion to a new memory block, classifying the new memory block as valid, and re-classifying the existing memory block as invalid.

9. The apparatus according to claim 7, wherein the processor is configured to reconstruct the new coherent snapshot by:
  constructing a first list containing the memory blocks that are classified as anchor and valid, and a second list containing the memory blocks that are classified as anchor and invalid; and
  reconstructing the new coherent snapshot based on the first and second lists.

10. The apparatus according to claim 9, wherein the processor is configured to reconstruct the new coherent snapshot by extracting the data from the memory blocks on the first list if the entire data is available in the memory blocks on the first list.

11. The apparatus according to claim 10, wherein, if the memory blocks on the first list do not comprise all the data, the processor is configured to reconstruct the new coherent snapshot by performing, per portion of the data:
  if the portion is available in the memory blocks on the second list, extracting the portion from the second list; and
  if the portion is not available in the memory blocks on the second list, extracting the portion from the first list.

12. The apparatus according to claim 7, wherein the processor is configured to classify each memory block by setting a respective valid/invalid flag and a respective anchor/non-anchor flag in each memory block.

13. A data storage apparatus, comprising:
  a non-volatile memory, comprising a set of memory blocks; and
  a memory controller, configured to:
    store data in the set of memory blocks;
    classify each memory block, which holds a respective portion of the data, as valid or invalid depending on whether the memory block holds a most updated version of the portion, and as anchor or non-anchor depending on whether the portion belongs to a coherent snapshot of the data;
    create a new coherent snapshot of the data, by:
      in a first phase, identifying the memory blocks in the set that are classified as valid and non-anchor, and re-classifying the identified memory blocks as anchor; and
      in a second phase, which begins only after all the memory blocks identified in the first phase as valid and non-anchor have been re-classified, finding for each memory block identified in the first phase a corresponding memory block that holds a previous version of the portion held by the memory block, and re-classifying the corresponding memory block as non-anchor; and upon recovering from a power interruption, to reconstruct the new coherent snapshot of the data from the memory blocks, based on classification of the memory blocks as valid or invalid and as anchor or non-anchor.

14. The apparatus according to claim 13, wherein the memory controller is configured to update the portion of the data that is stored in an existing memory block by writing the updated portion to a new memory block, classifying the new memory block as valid, and re-classifying the existing memory block as invalid.

15. The apparatus according to claim 13, wherein the memory controller is configured to reconstruct the new coherent snapshot by:

constructing a first list containing the memory blocks that are classified as anchor and valid, and a second list containing the memory blocks that are classified as anchor and invalid; and reconstructing the new coherent snapshot based on the first and second lists.

16. The apparatus according to claim 15, wherein the memory controller is configured to reconstruct the new coherent snapshot by extracting the data from the memory blocks on the first list if the entire data is available in the memory blocks on the first list.

17. The apparatus according to claim 16, wherein, if the memory blocks on the first list do not comprise all the data, the memory controller is configured to reconstruct the new coherent snapshot by performing, per portion of the data:

if the portion is available in the memory blocks on the second list, extracting the portion from the second list; and if the portion is not available in the memory blocks on the second list, extracting the portion from the first list.

18. The apparatus according to claim 13, wherein the memory controller is configured to classify each memory block by setting a respective valid/invalid flag and a respective anchor/non-anchor flag in each memory block.

* * * * *

UNITED STATES PATENT AND TRADEMARK OFFICE
CERTIFICATE OF CORRECTION

PATENT NO. : 10,025,669 B2
APPLICATION NO. : 14/975882
DATED : July 17, 2018
INVENTOR(S) : Boaz Tabachnik, Ziv Hersman and Yael Kanter It is certified that error appears in the above-identified patent and that said Letters Patent is hereby corrected as shown below:

On the Title Page

Column 1, item (72), the residence address of the inventor Boaz Tabachnik should read Moshav Gamzu.

Signed and Sealed this
Twenty-eighth Day of August, 2018

Andrei Iancu
*Director of the United States Patent and Trademark Office*